United States Patent
Hwang et al.

(10) Patent No.: US 10,381,492 B2
(45) Date of Patent: Aug. 13, 2019

(54) MOS CAPACITOR AND IMAGE SENSOR HAVING THE SAME

(71) Applicant: SK hynix Inc., Gyeonggi-do (KR)

(72) Inventors: Sun-Ha Hwang, Gyeonggi-do (KR);
Pyong-Su Kwag, Chungcheongbuk-do (KR); Sang-Uk Park, Chungcheongbuk-do (KR);
Kwang-Deok Kim, Gyeonggi-do (KR);
Ho-Ryeong Lee, Gyeonggi-do (KR);
Ju-Tae Ryu, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 30 days.

(21) Appl. No.: 15/709,977

(22) Filed: Sep. 20, 2017

(65) Prior Publication Data

US 2018/0277688 A1    Sep. 27, 2018

(30) Foreign Application Priority Data

Mar. 27, 2017  (KR) .................. 10-2017-0038201

(51) Int. Cl.
*H01L 29/94* (2006.01)
*H01L 27/146* (2006.01)
*H01L 49/02* (2006.01)
*H01L 23/522* (2006.01)
*H01L 27/08* (2006.01)

(52) U.S. Cl.
CPC ........ *H01L 29/94* (2013.01); *H01L 27/14614* (2013.01); *H01L 28/60* (2013.01); *H01L 28/86* (2013.01); *H01L 23/5223* (2013.01); *H01L 27/0805* (2013.01)

(58) Field of Classification Search
None
See application file for complete search history.

(56) References Cited

U.S. PATENT DOCUMENTS 5,923,062 A * 7/1999 Ohno .................. H01L 27/0688
  257/296
9,293,606 B2   3/2016 Chen et al.

\* cited by examiner

*Primary Examiner* — Long Pham
(74) *Attorney, Agent, or Firm* — IP & T Group LLP

(57) ABSTRACT

A MOS capacitor may include: an isolation layer formed in a substrate and defining an active region; a first electrode formed in the active region, and including an impurity region spaced from the isolation layer; and a second electrode formed over the substrate overlapping the impurity region, and including a gate having a plurality of gate patterns adjacent to each other with a gap therebetween.

10 Claims, 5 Drawing Sheets

MOS CAPACITOR AND IMAGE SENSOR HAVING THE SAME

CROSS-REFERENCE TO RELATED APPLICATIONS

This application claims priority under 35 U.S.C. § 119 to Korean Patent Application No. 10-2017-0038201 filed on Mar. 27, 2017 with the Korean Intellectual Property Office, the disclosure of which is incorporated herein by reference in its entirety.

TECHNICAL FIELD

Various embodiments of the present invention relate to a semiconductor device fabrication technology, and more particularly, to a MOS capacitor and an image sensor having the same.

DISCUSSION OF THE RELATED ART

An image sensor refers to a device that converts an optical image into an electrical signal. Recently, with the development of computer industry and communication industry, the demand for an enhanced image sensor with a high integration density is increasing in various fields such as a digital camera, a camcorder, a PCS (Personal Communication System), a game machine, a security camera, a medical micro-camera and a robot.

SUMMARY

Various embodiments are directed to an enhanced MOS capacitor and an image sensor having the same.

In an embodiment, a MOS capacitor may include an isolation layer formed in a substrate and defining an active region; a first electrode formed in the active region, and including an impurity region spaced from the isolation layer; and a second electrode formed over the substrate overlapping the impurity region, and including a gate having a plurality of gate patterns adjacent to each other with a gap therebetween.

The first electrode may further include an ohmic contact layer formed on the impurity region at either side of the gate, and the ohmic contact layer positioned at an edge of the impurity region may be spaced from an end of the impurity region. The gate may have a mesh-type planar shape. The gate may include a plurality of first gate patterns extended in a first direction and a plurality of second gate patterns extended in a second direction intersecting with the first direction, and a distance between the first gate patterns adjacent in the second direction may be substantially equal to a distance between the second gate patterns adjacent in the first direction.

In an embodiment, a MOS capacitor may include: an isolation layer formed in a substrate to define an active region; a first electrode comprising: an impurity region formed in the active region and spaced from the isolation layer; a plurality of first plugs electrically coupled to the impurity region through an interlayer dielectric layer formed over the substrate; and one or more first conductive patterns formed over the interlayer dielectric layer and electrically coupled to the plurality of first plugs; and a second electrode comprising: a gate formed over the substrate overlapping the impurity region and having a plurality of gate patterns adjacent to each other with a gap therebetween; a plurality of second plugs electrically coupled to the gate through the interlayer dielectric layer; and one or more second conductive patterns formed over the interlayer dielectric layer and electrically coupled to the plurality of second plugs.

The first electrode may further include an ohmic contact layer formed on the impurity region at either side of the gate, and the ohmic contact layer positioned at an edge of the impurity region may be spaced from an end of the impurity region. The gate may have a mesh-type planar shape. The gate may include a plurality of first gate patterns extended in a first direction and a plurality of second gate patterns extended in a second direction intersecting with the first direction, and a distance between the first gate patterns adjacent in the second direction may be substantially equal to a distance between the second gate patterns adjacent in the first direction. The plurality of first plugs may be positioned adjacent to the plurality of gate patterns. The MOS capacitor may further include spacers formed on the sidewalls of the gate, wherein the plurality of first plugs may be in contact with the spacers. The plurality of first plugs may be positioned between the respective gate patterns. Each of the first plugs may have a structure in which two or more sidewalls thereof face the sidewalls of the plurality of gate patterns. The one or more f the first conductive patterns and one or more of the second conductive patterns may have a bar shape extended in a first direction, and may be positioned adjacent to each other in a second direction intersecting with the first direction. One or more of the first conductive patterns and one or more of the second conductive patterns may be alternately arranged in the second direction.

In an embodiment, a image sensor with a global shutter function may include: a photoelectric conversion element suitable for generating photocharges in response to incident light; a charge storage element coupled to the photoelectric conversion element through a storage transistor; and a floating diffusion coupled to the charge storage element through a transmission transistor, the charge storage element comprising a MOS capacitor. The MOS capacitor may include: an isolation layer formed in a substrate and defining an active region; a first electrode formed in the active region, and comprising an impurity region spaced from the isolation layer; and a second electrode formed over the substrate overlapping the impurity region, and comprising a gate having a plurality of gate patterns adjacent to each other with a gap therebetween.

The first electrode may further include: a plurality of first plugs electrically coupled to the impurity region through an interlayer dielectric layer formed over the substrate; and one or more first conductive patterns formed over the interlayer dielectric layer and electrically coupled to the plurality of first plugs. The second electrode may further include: a plurality of second plugs electrically coupled to the gate through the interlayer dielectric layer; and one or more second conductive patterns formed over the interlayer dielectric layer and electrically coupled to the plurality of second plugs. The gate may have a mesh-type planar shape.

In an embodiment, an image sensor may include: a pixel array; a row decoder selecting a pixel in the pixel array; a ramp signal generation unit generating a ramp signal; a first sampling capacitor coupled to one input terminal of a comparator, and suitable for sampling the value of a pixel signal transmitted from the pixel array; and a second sampling capacitor coupled to the other input terminal of the comparator, and suitable for sampling the value of the ramp signal transmitted from the ramp signal generation unit, wherein the first and second sampling capacitors comprise a MOS capacitor. The MOS capacitor may include: an isolation layer formed in a substrate and defining an active region a first electrode formed in the active region, and comprising an impurity region spaced from the isolation layer; and a second electrode formed over the substrate overlapping the impurity region and comprising a gate having a plurality of gate patterns adjacent to each other with a gap therebetween.

The first electrode may further include: a plurality of first plugs electrically coupled to the impurity region through an interlayer dielectric layer formed over the substrate; and one or more first conductive patterns formed over the interlayer d electric layer and electrically coupled to the plurality of first plugs. The second electrode may further include: a plurality of second plugs electrically coupled to the gate through the interlayer dielectric layer; and one or more second conductive patterns formed over the interlayer dielectric layer and electrically coupled to the plurality of second plugs. The gate may have a mesh-type planar shape.

DETAILED DESCRIPTION

Figure 1:
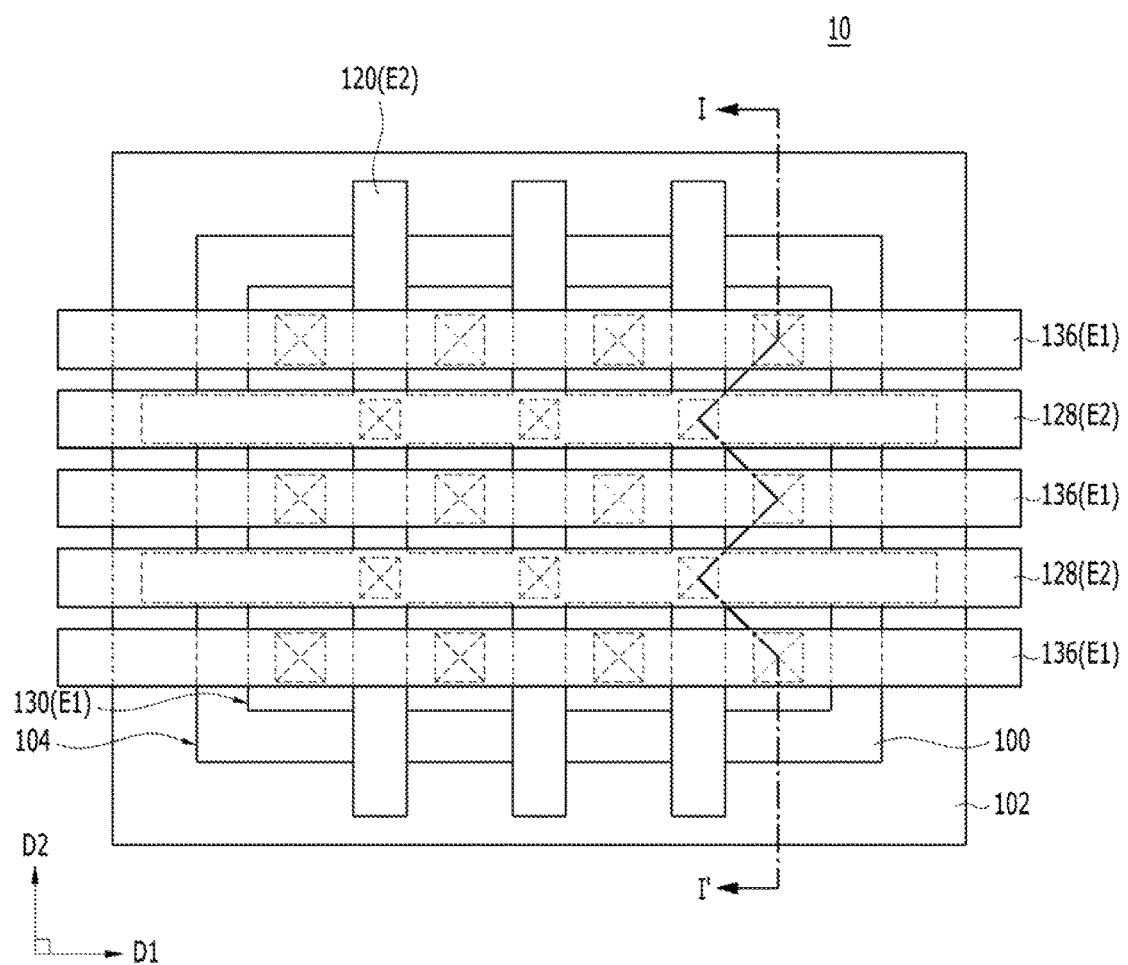
FIGS. 1 and 2 are plan views illustrating a MOS capacitor according to an embodiment of the present invention.

Various embodiments will be described below in more detail with reference to the accompanying drawings. The drawings may not be necessarily to scale and in some instances proportions of at least some of structures in the drawings may have been exaggerated in order to dearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Various embodiments may provide an enhanced MOS capacitor and an image sensor having the same. The enhanced MOS capacitor may indicate a MOS capacitor capable of not only improving capacitance without an area increase, but also preventing a characteristic degradation caused by a leakage current. For reference, the MOS capacitor can simplify a manufacturing process, compared to an MIM (Metal-Insulator-Metal) capacitor. On the other hand, since the MOS capacitor uses a gate dielectric layer as a dielectric substance, the size of the MOS capacitor, for example, the area thereof needs to be increased in order to increase its capacitance. Furthermore, since the MOS capacitor necessarily has an impurity region formed in a substrate, the characteristic of the MOS capacitor may be degraded by a leakage current caused by the impurity region.

Figure 2:
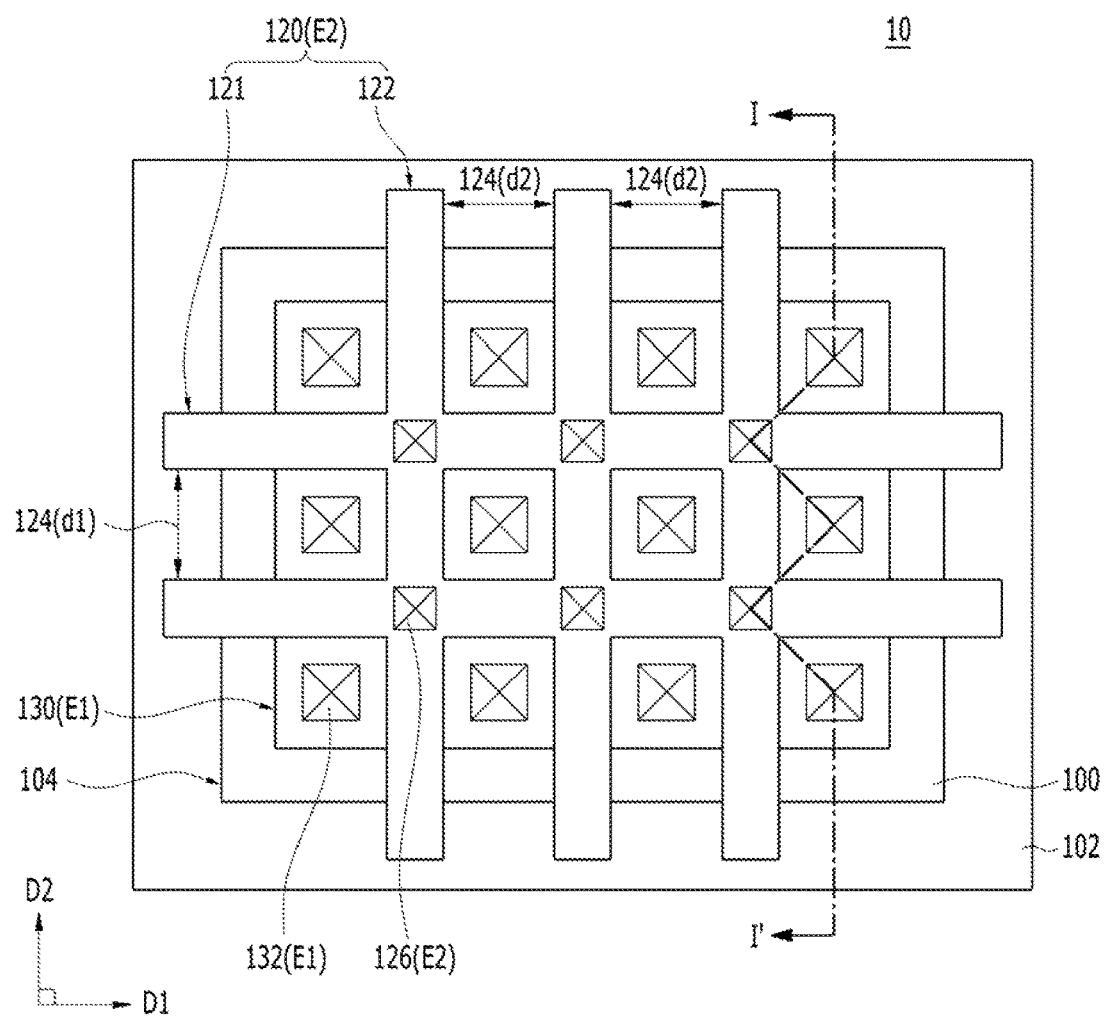
Figure 3:
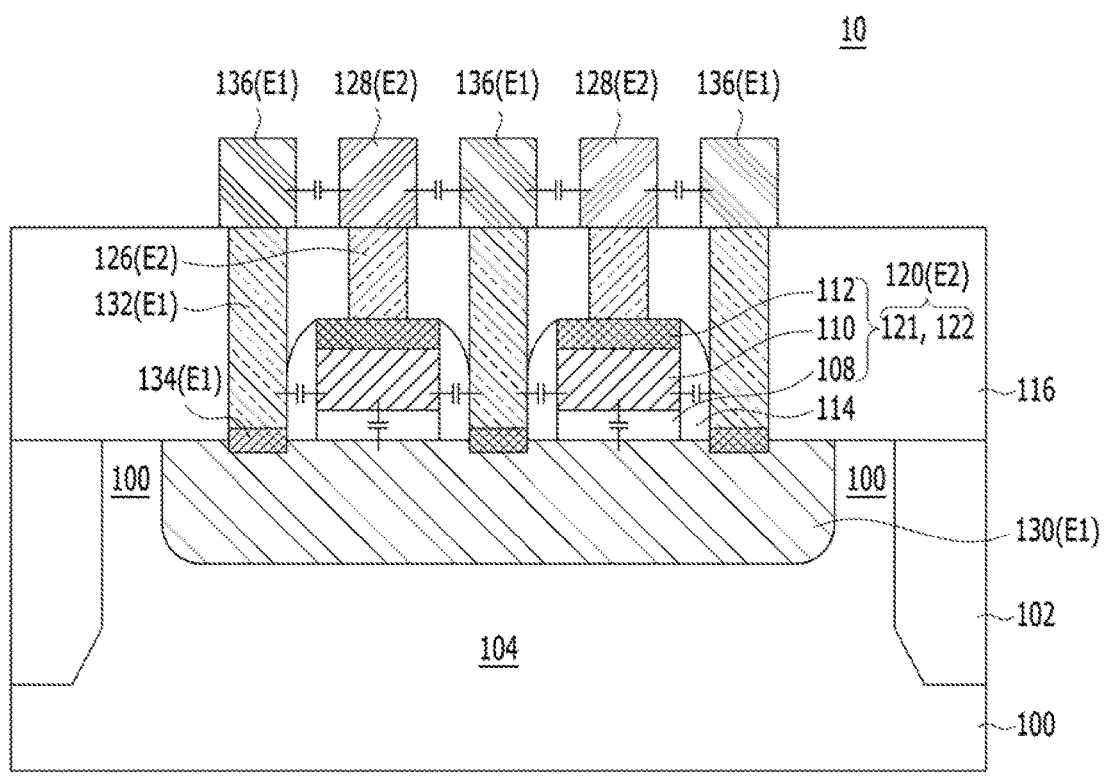
FIG. 3 is a cross-sectional view of a MOS capacitor according to an embodiment of the present invention, taken along line I-I' of FIGS. 1 and 2.

FIGS. 1 and 2 are plan views of a MOS capacitor according to an embodiment of the present invention, and FIG. 3 is a cross-sectional view of the MOS capacitor, taken along line I-I' of FIGS. 1 and 2. FIG. 1 is a plan view at a metal line level, and FIG. 2 is a plan view at a gate level.

As illustrated in FIGS. 1 to 3 the MOS capacitor, according to the present embodiment, may include an isolation layer 102 formed in a substrate 100. The isolation layer 102 may define an active region 104. The active region 104 may indicate a region where a MOS capacitor 10 is to be formed. Therefore, the active region 104 defined by the isolation layer 102 may have various planar shapes.

The substrate 100 may include a semiconductor substrate. The semiconductor substrate may have a single crystal state, and include a silicon containing material. That is, the substrate 100 may include a single-crystal silicon containing material. For example, the substrate 100 may include a bulk silicon substrate. The isolation layer 102 may include a shallow trench isolation (STI) or a deep trench isolation (DTI). That is, the isolation layer 102 may include an isolation trench formed in the substrate 100 and an insulating layer in the isolation trench. The active region 104 defined by the isolation layer 102 may have various planar shapes.

The MOS capacitor 10, according to the present embodiment, may include a first electrode E1 having an impurity region 130 formed in the active region 104. The impurity region 130 may include a well. The impurity region 130 may be formed by ion-implanting P-type or N-type impurities into the substrate 100. For example, the P-type impurities may include boron (B), and the N-type impurities may include arsenic (As) and phosphorous (P).

In order to prevent a characteristic degradation of the MOS capacitor 10 that is caused by a leakage current, the impurity region 130 may be separated by a predetermined distance from the isolation layer 102. That is, the impurity region 130 may be formed not to be in contact with the isolation layer 102. For reference, when the impurity region 130 and the isolation layer 102 are in contact with each other, the contact surface between the impurity region 130 and the isolation layer 102 may serve as a source and a path of the leakage current, due to a plurality of defects present at the surface of the isolation layer 102. Furthermore, a dopant (impurity), which is implanted into the substrate 100 to form the impurity region 130, may diffuse into the isolation layer 102. Such a phenomenon may be referred to as dopant segregation. The dopant segregation may reduce the thickness of the impurity region 130 adjacent to the isolation layer 102, while lowering the impurity doping concentration. When the thickness of the impurity region 130 is reduced, a tolerance to an electric field may be reduced to easily cause the leakage current, and when the impurity doping concentration is lowered, the resistance of the impurity region 130 may be increased. In the MOS capacitor 10, however, the impurity region 130 are spaced from the isolation layer 102 such that the impurity region 130 and the isolation layer 102 are not in contact with each other, making it possible to prevent the above-described problems.

The MOS capacitor 10 may include a second electrode E2, which has a gate 120 formed on the substrate 100 overlapping the impurity region 130. In order to increase a capacitance of the MOS capacitor 10 without an area increase, the gate 120 may have a mesh-type planar shape. Thus, the gate 120 may include a plurality of gate patterns 121 and 122 adjacent to each other with a gap 124 provided therebetween. For example, the gate 120 may include a plurality of first gate patterns 121 extended in a first direction D1 and a plurality of second gate patterns 122 extended in a second direction D2 intersecting with the first direction D1. A distance d1 between the first gate patterns 121 adjacent in the second direction D2 may be equal to a distance d2 between the second gate patterns 122 adjacent in the first direction (d1=d2). In other words, the distances between the adjacent gate patterns 121 and 122, that is the line widths of the gaps 124 may be equal to each other.

The gate 120 including the plurality of gate patterns 121 and 122 may have a structure in which a gate dielectric layer 108, a first gate electrode 110, and a second gate electrode 112 are sequentially stacked. The gate dielectric layer 108 may include a single layer including materials selected from a group comprising of oxide, nitride, and oxynitride, or include a multilayer formed of two or more layers thereof. As publicly known, the gate dielectric layer 108 may serve as a dielectric layer of the MOS capacitor 10. The first gate electrode 110 and the second gate electrode 112 may include a semiconductor material or a metallic material. For example, the first gate electrode 110 may include a silicon layer, and the second gate electrode 112 may include a metal silicide layer. In this case, the second gate electrode 112 may serve as an ohmic contact for a second plug 126, which electrically couples a second conductive pattern 128 and the gate 120, thereby reducing a contact resistance and reducing a resistance of the gate 120.

The MOS capacitor 10 may further include a spacer 114 formed on a sidewall of the gate 120 and an interlayer dielectric layer 116 formed over the substrate 100 to cover the gate 120. The spacer 114 and the interlayer dielectric layer 116 may include a single layer including materials selected from a group comprising of oxide, nitride, and oxynitride, or include a multilayer formed of two or more layers thereof. The spacer 114 may not only protect side surfaces of the gate 120, but also serve as a dielectric layer of the MOS capacitor 10 together with the gate dielectric layer 108.

The first electrode E1 of the MOS capacitor 10, according to the present embodiment, may include a plurality of first plugs 132 and an ohmic contact layer 134. The plurality of first plugs 132 may be electrically coupled to the impurity region 130 through the interlayer dielectric layer 116, and the ohmic contact layer 134 may be formed between the plurality of first plugs 132 and the impurity region 130. The first electrode E1 of the MOS capacitor 10 according to the present embodiment may further include junction regions formed in the impurity region 130 at both sides of the gate 120, that is, a source and a drain. The junction regions may have a higher impurity doping concentration than the impurity region 130.

In order to increase the capacitance of the MOS capacitor 10 without increasing the area thereof, the plurality of first plugs 132 may be positioned adjacent to the plurality of gate patterns 121 and 122. For example, the spacer 114 may be buried between the plurality of first plugs 132 and the plurality of gate patterns 121 and 122. That is, the plurality of first plugs 132 may be in contact with the spacer 114. A capacitance may occur between the plurality of first plugs 132 and the plurality of gate patterns 121 and 122 in a horizontal direction, and the spacer 114 may serve as a dielectric layer of a capacitor. The capacitance of the MOS capacitor 10 may be increased as much as the capacitance between the plurality of first plugs 132 and the plurality of gate patterns 121 and 122.

In order to further increase the capacitance of the MOS capacitor 10 without increasing the area thereof, the first plugs 132 may be positioned between the respective gate patterns 121 and 122. This is for increasing the area where the plurality of first plugs 132 and the plurality of gate patterns 121 and 122 face each other. Specifically, each of the first plugs 132 may have a structure in which two or more sidewalls thereof face the sidewalls of the gate patterns 121 and 122. For this structure, the plurality of first plugs 132 may have a square planar shape.

The ohmic contact layer 134 may be formed on the impurity region 130 at either side of the gate 120. That is, the ohmic contact layer 134 may be formed on the impurity region 130 exposed by the gate 120. In other words, the ohmic contact layer 134 may be formed in the impurity region 130 not overlapping the gate 120. Also, the ohmic contact layer 134 may be formed to be partially buried in the impurity region 130 at either side of the gate 120. The ohmic contact layer 134 may serve to reduce the contact resistance between the impurity region 130 and the plurality of first plugs 132, and include a metallic material. For example, the ohmic contact layer 134 may include a metal silicide layer.

In order to prevent a characteristic degradation of the MOS capacitor 10 that is caused by the leakage current, the ohmic contact layer 134 positioned on the edge of the impurity region 130 should be spaced from the end of the impurity region 130. For reference, when the ohmic contact layer 134 is extended to the end of the impurity region 130, the ohmic contact layer 134 may have a relatively large thickness along an end boundary of the impurity region 130 due to the properties of a metal silicide formation process. In this case, the ohmic contact layer 134 may serve as the source and a path of the leakage current. However, since the ohmic contact layer 134 positioned on the edge of the impurity region 130 is spaced from the end of the impurity region 130, the MOS capacitor 10 according to the present embodiment can prevent the above-described problem.

In the MOS capacitor 10, the first electrode E1 may include one or more first conductive patterns 136, which are formed on the interlayer dielectric layer 116 and electrically coupled to the plurality of first plugs 132. Furthermore, the second electrode E2 of the MOS capacitor 10 may include a plurality of second plugs 126 and one or more second conductive patterns 128. The plurality of second plugs 126 may be electrically coupled to the gate 120 through the interlayer dielectric layer 116, and one or more of the second conductive patterns 128 may be formed on the interlayer dielectric layer 116 to be electrically coupled to the respective second plugs 126. Although not illustrated, an insulating layer may be buried between the first and second conductive patterns 136 and 128. The insulating layer may include a spacer formed on the sidewalls of the first conductive patterns 136 and second conductive patterns 128. The insulating layer may serve as a dielectric layer of a capacitor using the first conductive pattern 136 and the second conductive pattern 128 as electrodes.

The first conductive pattern 136 and the second conductive pattern 128 may have a bar shape extending in the first direction D1. In order to increase the capacitance of the MOS capacitor 10 without increasing the area thereof, the first conductive pattern 136 and the second conductive pattern 128 may be positioned adjacent to each other in the second direction D2. Furthermore, one or more of the first conductive patterns 136 and one or more of the second conductive patterns 128 may be alternately arranged in the second direction D2.

The plurality of second plugs 126 may be formed at each of the intersections of the gate 120 having a mesh shape. This is for providing spaces in which the plurality of first plugs 132 and the plurality of second plugs 126 are to be stably formed. If a sufficient formation space for the first plug 32 and the second plug 126 is provided, the plurality of first plugs 132 may be positioned on the same lines as the plurality of second plugs 126 in the first direction D1 or/and the second direction D2. In this case, since the capacitance also occurs between the plurality of first plugs 132 and the plurality of second plugs 126, the capacitance of the MOS capacitor 10 can be further increased.

The MOS capacitor 10 according to the present embodiment can improve the capacitance without an area increase, and prevent a characteristic degradation caused by the leakage current.

Figure 4:
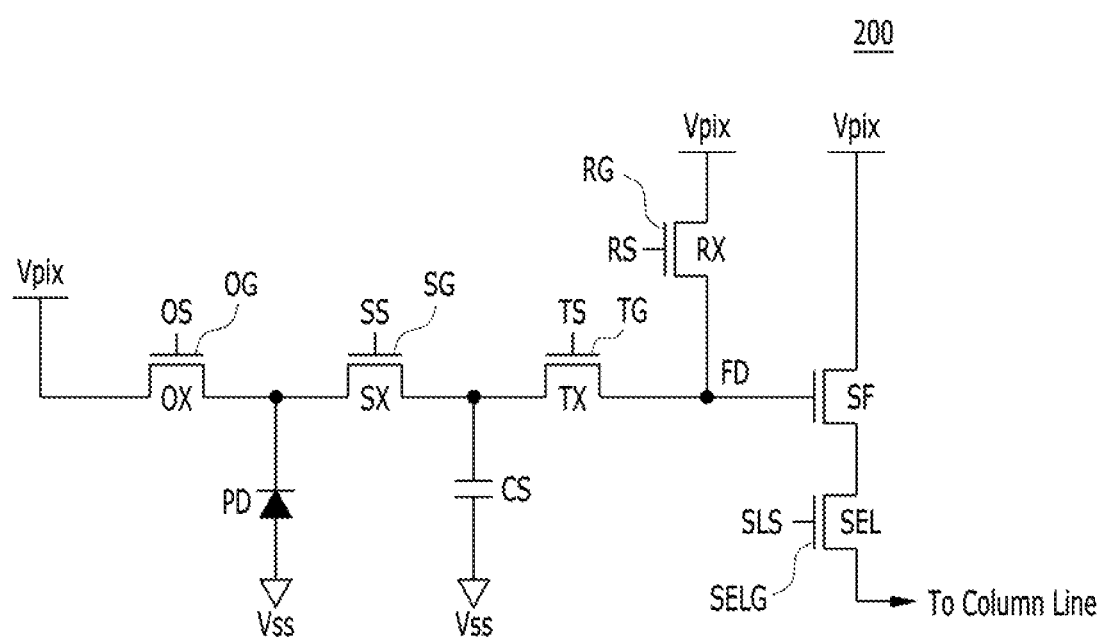
FIG. 4 is a diagram illustrating a unit pixel equivalent circuit in an image sensor with a global shutter function according to an embodiment of the present invention.
Figure 5:
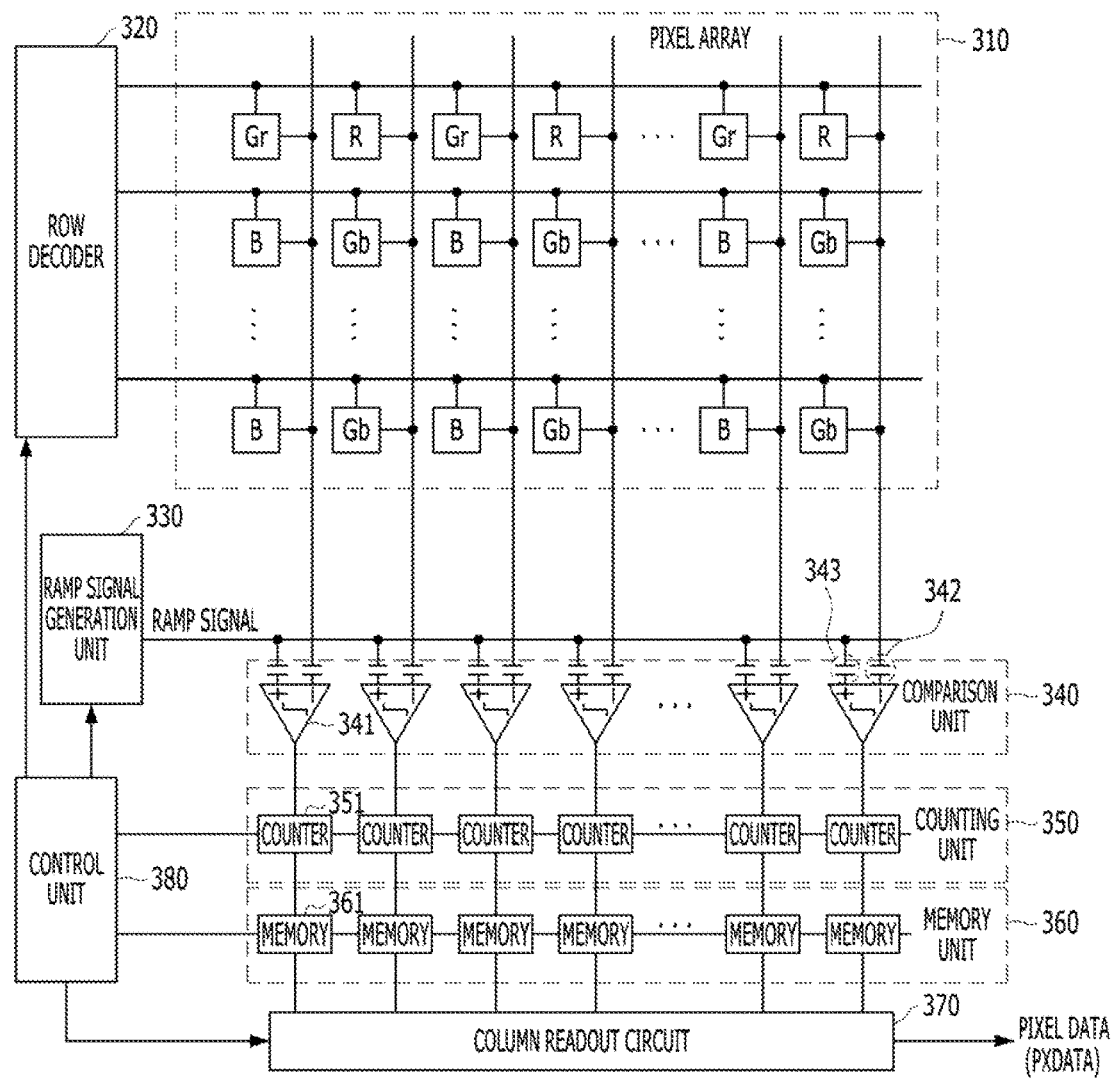
FIG. 5 is a block diagram schematically illustrating an image sensor that performs a sampling operation according to an embodiment of the present invention.

The MOS capacitor according to the present embodiment may be used for various electronic devices. Hereafter, referring to FIGS. 4 and 5, an application of the MOS capacitor 10, according to the present embodiment, to an image sensor will be described. For reference, FIG. 4 illustrates the case in which the MOS capacitor according to the present embodiment is applied to an image sensor with a global shutter function. FIG. 5 illustrates the case in which the MOS capacitor according to the present embodiment is applied to an image sensor that performs a sampling operation.

FIG. 4 is a diagram illustrating a unit pixel equivalent circuit of the image sensor with the global shutter function according to an embodiment of the present invention.

As illustrated in FIG. 4, a unit pixel 200 may include a photo diode PD, an overflow transistor OX, a storage transistor SX, a charge storage element CS, a transmission transistor TX, a reset transistor RX, a source follower transistor SF, and a selection transistor SEL.

The photo diode PD may accumulate photocharges generated in response to incident light. The photo diode PD is an example of a photoelectric conversion element, and may include one or more of a photo diode, a photo transistor, a photo gate, a pinned photo diode (PPD), and combinations thereof.

The overflow transistor OX may be coupled between a pixel voltage Vpix and the photo diode PD. A gate OG of the overflow transistor OX may be used to prevent charges which are generated by the photo diode PD, from overflowing to the charge storage element CS. The overflow transistor OX may be turned on or off in response to an overflow control signal OS. For example, when the intensity of light incident on the unit pixel 200 is high or when photocharges generated at times other than an integration time are accumulated in the photo diode PD, the overflow transistor OX may prevent the photocharges (for example, electrons), which are generated by the photo diode PD, from overflowing to the charge storage element CS. The overflow transistor OX may be used to remove (or reset) the photocharges accumulated in the photo diode PD immediately before the start of the integration time.

The storage transistor SX may be coupled between the photo diode PD and the charge storage element CS, and the charges transmitted from the photo diode PD may be stored in the charge storage element CS through the storage transistor SX. The storage transistor SX may be turned on or off in response to a storage control signal SS supplied to a gate SG of the storage transistor SX.

The charge storage element CS may store the charges transmitted from the photo diode PD, and be implemented with the MOS capacitor 10, which includes the MOS capacitor described with reference to FIGS. 1 to 3. Each of the photo diode PD and the charge storage element CS may be coupled to a ground voltage VSS.

The transmission transistor TX may be coupled between the charge storage element CS and a floating diffusion node FD. The charges stored in the charge storage element CS may be stored in the floating diffusion node FD through the transmission transistor TX. The transmission transistor TX may be turned on or off in response to a transmission control signal TS supplied through gate TG.

The reset transistor RX may be coupled between the pixel voltage Vpix and the floating diffusion node FD, and remove the photocharges (for example, electrons) of the floating diffusion node FD in response to a reset control signal RS. That is, when the reset transistor RX is turned on, a voltage level of the floating diffusion node FD may be reset to the pixel voltage Vpix. The pixel voltage Vpix may be equal to or lower than a supply voltage of 5V, for example.

The source follower transistor SF may be coupled between the pixel voltage Vpix and the selection transistor SEL, and operated on a voltage level, which is determined according to the charges on the floating diffusion node FD. The selection transistor SEL may transfer an output signal of the source follower transistor SF, for example, a pixel signal, into a column line in response to a select signal SLS.

When the MOS capacitor 10 according to the present embodiment is applied as the charge storage element in the image sensor with the global shutter function, the characteristic of the global shutter operation can be improved, because of the improved capacitance without an area increase and prevention of the characteristic degradation caused by the leakage current.

FIG. 5 is a block diagram schematically illustrating the image sensor that performs the sampling operation according to an embodiment of the present invention.

As illustrated in FIG. 5, the image sensor may include a pixel array 310, a row decoder 320, a ramp signal generation unit 330, a comparison unit 340, a counting unit 350, a memory unit 360, a control unit 380, and a column readout circuit 370. The pixel array 310 may output a pixel signal VPIXEL corresponding to incident light. The row decoder 320 may select a pixel in the pixel array 310 at each row line under the control of the control unit 380 (for example, timing generator), and control the operation of the selected pixel. The ramp signal generation unit 330 may generate a ramp signal under the control of the control unit 380. The comparison unit 340 may compare the value of the ramp signal inputted from the ramp signal generation unit 330 to the value of each pixel signal outputted from the pixel array 310. The counting unit 350 may count a clock inputted from the control unit 380 according to each output signal of the comparison unit 340. The counting unit 350 may include a plurality of counters 351 arranged at the respective columns. The memory unit 360 may store the counting information provided from the counting unit 350 under the control of the control unit 380. The memory unit 360 may include a plurality of memories 361 arranged at the respective columns. The control unit 380 may control the operations of the row decoder 320, the ramp signal generation unit 330, the counting unit 350, the memory unit 360, and the column readout circuit 370. The column readout circuit 370 may sequentially output the data of the memory unit 360 as pixel data PXDATA under the control of the control unit 380.

The above-described image sensor may compare pixel signals (pixel output voltages) before and after an optical signal is received, and measure only a pixel signal generated by the incident light, in order to remove an offset value of a pixel. Such a technique may be referred to as a correlated double sampling (CDS). The CDS may be performed by the comparison unit 340.

The comparison unit 340 may include a plurality of comparators 341 arranged at, the respective columns. Each of the comparators 341 may include a first sampling capacitor 342 and a second sampling capacitor 343. The first sampling capacitor 342 may be coupled to one input terminal of the corresponding comparator 341 and sample the value of a pixel signal. The second sampling capacitor 343 may be coupled to the other input terminal of the comparator 341, and sample the value of a ramp signal. The first sampling capacitor 342 and the second sampling capacitors 343 may include the MOS capacitor 10, which has been described with reference to FIGS. 1 to 3.

In the image sensor that performs the CDS, the MOS capacitor 10 according to the present embodiment can be applied as the sampling capacitors 342 and 343 and improve the characteristic of the CDS operation, because of the improved capacitance without an area increase and prevention of the characteristic degradation caused by the leakage current.

According to the present embodiment, the capacitance of the MOS capacitor can be improved without an area increase, which makes it possible to prevent a characteristic degradation of the MOS capacitor that is caused by a leakage current.

Although various embodiments have been described for illustrative purposes, it will be apparent to those skilled in the art that various changes and modifications may be made without departing from the spirit and scope of the invention as defined in the following claims.

What is claimed is:

1. A MOS capacitor comprising:
   an isolation layer formed in a substrate to define an active region;
   a first electrode comprising: an impurity region formed in the active region and spaced from the isolation layer; a plurality of first plugs electrically coupled to the impurity region through an interlayer dielectric layer formed over the substrate; and one or more first conductive patterns formed over the interlayer dielectric layer and electrically coupled to the plurality of first plugs; and
   a second electrode comprising: a gate formed over the substrate overlapping the impurity region and having a plurality of gate patterns adjacent to each other with a gap therebetween; a plurality of second plugs electrically coupled to the gate through the interlayer dielectric layer; and one or more second conductive patterns formed over the interlayer dielectric layer and electrically coupled to the plurality of second plugs.

2. The MOS capacitor of claim 1, wherein the first electrode further comprises an ohmic contact layer formed between the plurality of first plugs and the impurity region, and the ohmic contact layer positioned at an edge of the impurity region is spaced from an end of the impurity region.

3. The MOS capacitor of claim 1, wherein the gate has a mesh-type planar shape.

4. The MOS capacitor of claim 1, wherein the gate comprises a plurality of first gate patterns extended in a first direction and a plurality of second gate patterns extended in a second direction intersecting with the first direction, and a distance between the first gate patterns adjacent in the second direction is substantially equal to a distance between the second gate patterns adjacent in the first direction.

5. The MOS capacitor of claim 1, wherein the plurality of first plugs are positioned adjacent to the plurality of gate patterns.

6. The MOS capacitor of claim 1, further comprising spacers formed on the sidewalls of the gate,
   wherein the plurality of first plugs are in contact with the spacers.

7. The MOS capacitor of claim 1, wherein the plurality of first plugs are positioned between the respective gate patterns.

8. The MOS capacitor of claim 1, wherein each of the first plugs has a structure in which two or more sidewalls thereof face the sidewalls of the plurality of gate patterns.

9. The MOS capacitor of claim 1, wherein the one or more of the first conductive patterns and one or more of the second conductive patterns have a bar shape extended in a first direction, and are positioned adjacent to each other in a second direction intersecting with the first direction.

10. The MOS capacitor of claim 9, wherein one or more of the first conductive patterns and one or more of the second conductive patterns are alternately arranged in the second direction.

* * * * *